US009359691B2

(12) United States Patent
Martini et al.

(10) Patent No.: US 9,359,691 B2
(45) Date of Patent: Jun. 7, 2016

(54) METHOD OF LOADING A CHARGE OF POLYSILICON INTO A CRUCIBLE

(71) Applicant: MEMC Electronic Materials S.p.A., Novara (IT)

(72) Inventors: Umberto Martini, Merano (IT); Luigi Bonanno, Merano (IT); Paolo Collareta, Merano (IT); Maria Porrini, Merano (IT)

(73) Assignee: MEMC Electronic Materials SpA, Novara (IT)

( * ) Notice: Subject to any disclaimer, the term of this patent is extended or adjusted under 35 U.S.C. 154(b) by 702 days.

(21) Appl. No.: 13/685,323

(22) Filed: Nov. 26, 2012

(65) Prior Publication Data

US 2014/0060422 A1 Mar. 6, 2014

Related U.S. Application Data

(63) Continuation of application No. PCT/IT2012/000270, filed on Sep. 5, 2012.

(51) Int. Cl.
*C30B 15/02* (2006.01)
*C30B 15/10* (2006.01)
*C30B 11/04* (2006.01)
*C30B 29/06* (2006.01)

(52) U.S. Cl.
CPC .............. *C30B 15/10* (2013.01); *C30B 11/04* (2013.01); *C30B 15/02* (2013.01); *C30B 29/06* (2013.01); *Y10T 117/1032* (2015.01)

(58) Field of Classification Search
CPC ................................ C30B 15/10; C30B 15/20
See application file for complete search history.

(56) References Cited

U.S. PATENT DOCUMENTS

| 5,814,148 A * | 9/1998 | Kim et al. ........................ 117/13 |
| 5,919,303 A | 7/1999 | Holder |
| 6,110,272 A | 8/2000 | Aikawa et al. |
| 6,284,040 B1 | 9/2001 | Holder et al. |
| 6,749,683 B2 * | 6/2004 | Holder ............................ 117/15 |
| 2003/0131783 A1 | 7/2003 | Arvidson |
| 2006/0000409 A1 | 1/2006 | Spangler et al. |

FOREIGN PATENT DOCUMENTS

| DE | 102006017622 A1 | 10/2007 |
| EP | 0787836 A2 | 8/1997 |
| WO | 0042243 A1 | 7/2000 |
| WO | 2012142514 A2 | 10/2012 |

OTHER PUBLICATIONS

PCT International Search Report and Written Opinion of the International Searching Authority mailed on Mar. 1, 2013 regarding PCT/IT2012/000270 filed on Sep. 5, 2012; 11 pgs.

* cited by examiner

*Primary Examiner* — Robert M Kunemund
(74) *Attorney, Agent, or Firm* — Armstrong Teasdale LLP

(57) ABSTRACT

A method of loading a crucible includes loading a first layer of polysilicon chunks into the crucible and loading a second layer of granular polysilicon into the crucible to form a polysilicon charge such that the packing density of the polysilicon charge within the crucible is greater than 0.70.

16 Claims, 5 Drawing Sheets

METHOD OF LOADING A CHARGE OF POLYSILICON INTO A CRUCIBLE

CROSS REFERENCE TO RELATED APPLICATIONS

This application is a Continuation Application of International Application No. PCT/IT2012/000270, filed Sep. 5, 2012, the disclosure of which is hereby incorporated by reference, in its entirety.

FIELD

The field relates generally to the production of silicon ingots, and more particularly to a method of loading or packing a charge of polycrystalline silicon material into a crucible for the production of silicon ingots.

BACKGROUND

Semiconductor chips are typically fabricated from single crystal silicon ingots. The single crystal silicon ingots are usually formed by the Czochralski (CZ) method. In the production of single silicon crystals grown by the CZ method, polycrystalline silicon in the form of granular polysilicon, chunk polysilicon or mixtures thereof is first melted within a crucible, such as a quartz crucible, of a crystal pulling device (also herein referred to as a "puller") to form a molten silicon melt. During the CZ process, a single crystal silicon ingot is produced by melting an initial charge of a polysilicon source material within a quartz crucible to form a molten silicon melt. The melt and the crucible are heated until the temperature has stabilized at an equilibrium temperature. A seed crystal is dipped into the melt and withdrawn as the source melt crystallizes on the seed to form the single crystal ingot. The ingot is pulled out of the melt as it grows.

The size of the single crystal ingot is limited by the amount of the melt within the crucible. Thus, for single crystal silicon ingots grown by the CZ method, it may be desirable to begin the process with a large initial polysilicon charge in the crucible, in order to maximize the theoretical process yield. The maximum charge size that can be loaded in the crucible before initiating the process is limited by geometrical constraints such as the crucible size and the hot zone design, particularly the shape and position of thermal shields that surround the crucible. One known method to address the geometrical limitations involves adding more polysilicon to the melt after having melted the initial charge of polysilicon material. However, this method requires fitting the puller with a feeding tool able to add polysilicon to the crucible during the process, specifically after having melted at least part of the initial charge.

However, adding polysilicon to the melt has disadvantages, such as the cost of fitting the puller with a feeding tool and the need to prepare small size chips or granular polysilicon from larger polysilicon chunks. The granular polysilicon typically also contains a high concentration of hydrogen, which may expand suddenly when the granules come in contact with the molten silicon melt. Adding polysilicon to the melt may also undesirably produce splashing or splattering of molten silicon. Further, gasses trapped within the added polysilicon may create gas bubbles within the melt that become entrained within the single crystal ingot. This may lead to the formation of dislocations, voids or other defects within the single crystal ingot.

In order to address the issue of hydrogen within the polysilicon granules, known methods either add a dehydrogenation step during the production of granular polysilicon, which further increases its cost, or retrofit the puller with a heater at the bottom of the crucible in order to melt the silicon charge from the bottom rather than from the side to keep a solid surface on which the granular polysilicon can fall without touching the melt. Thus, known methods of adding polysilicon to the melt add cost, complexity and potential manufacturing defects to the CZ process.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

In one aspect, a method of loading a crucible includes loading a first layer of polysilicon chunks into the crucible and loading a second layer of granular polysilicon into the crucible. The packing density of polysilicon within the crucible is greater than about 0.70.

In another aspect, a crucible includes a first layer of polysilicon chunks within the crucible and a second layer of granular polysilicon within the crucible. The packing density of the combination of the first layer and the second layer of polysilicon within the crucible is greater than about 0.70.

DETAILED DESCRIPTION

Figure 1:
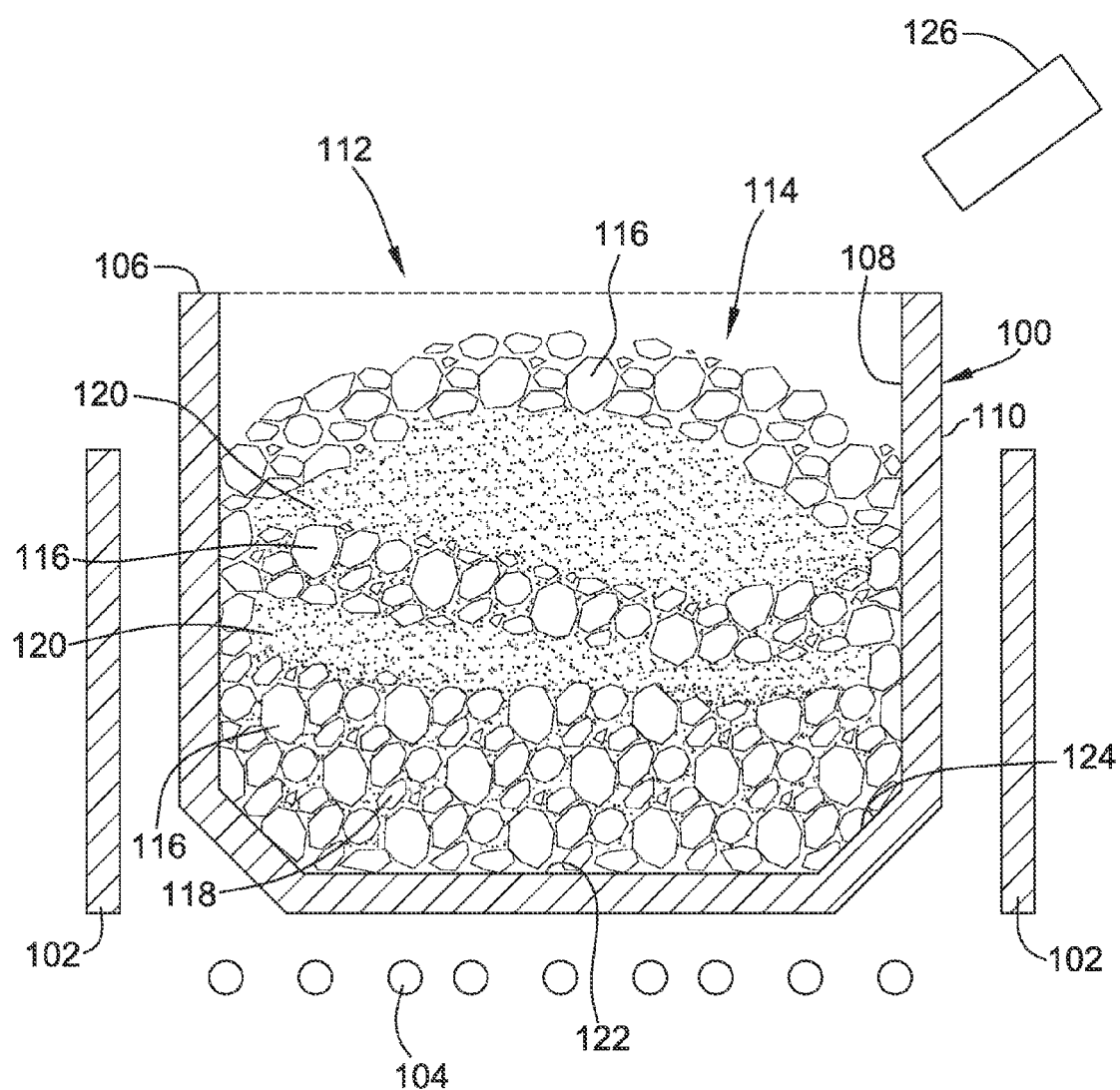
FIG. 1 is a partially schematic sectional view of a crucible containing a charge of polysilicon material.

The embodiments described herein generally relate to methods for loading a crucible with a polysilicon charge to increase the packing density of the charge. Referring to the drawings, FIG. 1 shows an exemplary crucible 100 used during heating and melting of a polysilicon charge. Crucible 100 may be supported by a suitable, movable support structure (not shown) of a crystal puller device. One or more side heaters 102 and bottom heaters 104 of the puller device are disposed in proximity to crucible 100 to heat crucible 100 and thereby melt the contents contained therein. The crucible 100 has an upper rim 106 that defines a top edge thereof. The crucible 100 has a generally U-shaped cross-section, and includes an inner wall 108 and an outer wall 110. The inner wall 108 generally defines an inner volume 112. An initial charge 114 of polysilicon to be melted is placed in the inner volume 112 of crucible 100. The initial charge 114 may include one or more polysilicon chunks 116, polysilicon particles 118 and polysilicon granules 120.

As referred to herein, a ratio between a volume occupied by the polysilicon charge 114 and the total inner volume 112 is referred to as "Packing Density" (PD). As used herein, polysilicon chunks 116 refer to the largest size of polysilicon material to be loaded within the crucible 100. Polysilicon chunks 116 have an irregular shape and when loaded in a crucible, result in a PD of approximately 0.55, (i.e., approximately 55% of the volume is filled with silicon while 45% remains empty). Polysilicon granules 120 refer to a smallest size of polysilicon material to be melted within the crucible 100. Polysilicon granules 120 are approximately spherical in shape and result in a PD of about 0.70. Polysilicon particles 118 refer to a medium size polysilicon material that is larger than polysilicon granules 120 but smaller than polysilicon chunks 116, which may have an irregular or regular shape and a PD between 0.55 and 0.70.

In this embodiment, the PD of the charge 114 is increased to a PD greater than the individual PD of any of the polysilicon chunks 116, polysilicon granules 120 and the polysilicon particles 118. In order to increase the PD of the charge 114, a mix of at least two types of polysilicon material are placed into the crucible 100.

In this embodiment, the PD of the charge satisfies the following equation (1):

$$PD_C = PD_L + (1-PD_L)PD_M + (1-PD_L)(1-PD_M)PD_S \qquad \text{Equation (1)}$$

Referring to Equation (1), $PD_C$ refers to the packing density of the charge 114, $PD_L$ refers to the packing density of the large particles or polysilicon chunks 116, $PD_M$ refers to the packing density of the medium size particles or polysilicon particles 118, and $PD_S$ refers to the packing density of the small size particles or polysilicon granules 120. Accordingly, an "empty fraction" $(1-PD_L)$ of the crucible volume 112 left by the polysilicon chunks 116 may be filled with polysilicon particles 118 with a packing density $PD=PD_M$, and the empty fraction $(1-PD_L)(1-PD_M)$ left by the combination of the polysilicon chunks 116 and the polysilicon particles 118 may be filled by the polysilicon granules having a packing density of $PD=PD_S$.

Accordingly, it is possible to achieve a packing density that is not achievable with only a single size of polysilicon material. In this embodiment, the condition to satisfy the equation is that the ratio of the dimensions between larger polysilicon chunks 116 and smaller particles (i.e., polysilicon granules 120 or polysilicon particles 118) is greater than 7 (a ratio of 7:1). For example, such condition is satisfied if polysilicon chunks 116 and polysilicon granules 120 are used, wherein the polysilicon granules 120 have a dimension about 10 times smaller than a dimension of polysilicon chunks 116 (ratio of 10:1). In other embodiments, the ratio may suitably be 50:1 or 100:1.

In this embodiment, mixes of polysilicon chunks 116 with a PD value of 0.55, and polysilicon granules 120 with a PD value of 0.70 are loaded into crucible 100 as an initial charge 114 to achieve a charge packing density $PD_C$ of 0.86, or about 0.90.

In addition to increasing the $PD_C$ to a level greater than the PD of a single polysilicon material, silicon splatters may be reduced or eliminated during the melting step because a full charge of polysilicon may be added to the crucible initially, rather than adding polysilicon material after melting has begun. In another embodiment, adding the entire granular polysilicon charge 114 directly into the crucible 100 before starting to melt the silicon allows time to out-gas the hydrogen contained in the polysilicon granules 120 during the gradual heating of the charge 114, so that when the granules come in contact with molten silicon within the crucible 100 the hydrogen content of the polysilicon granules 120 is already reduced sufficiently to avoid splatters or the formation of gas pockets.

In this embodiment, direct contact of polysilicon granules with the crucible inner wall 108 is avoided. In this embodiment, a layer of polysilicon chunks 116 is placed in contact with the crucible bottom 122 and curvature region 124 before adding a layer of polysilicon granules 120. In this way, damage to the crucible (pitting) may be substantially avoided during melting of the charge 114, as well as the trapping of extremely numerous very small gas bubbles that would otherwise be trapped between the granules 120 and the crucible inner wall 108. For example, it may be desirable to avoid pitting and gas bubbles because both these bubbles and the crucible pits can be a source of gas bubbles or gas pockets in the melt that may dislodge from the crucible inner wall 108, float through the melt and eventually get entrained into the growing crystal ingot, causing a defect.

Figure 2:
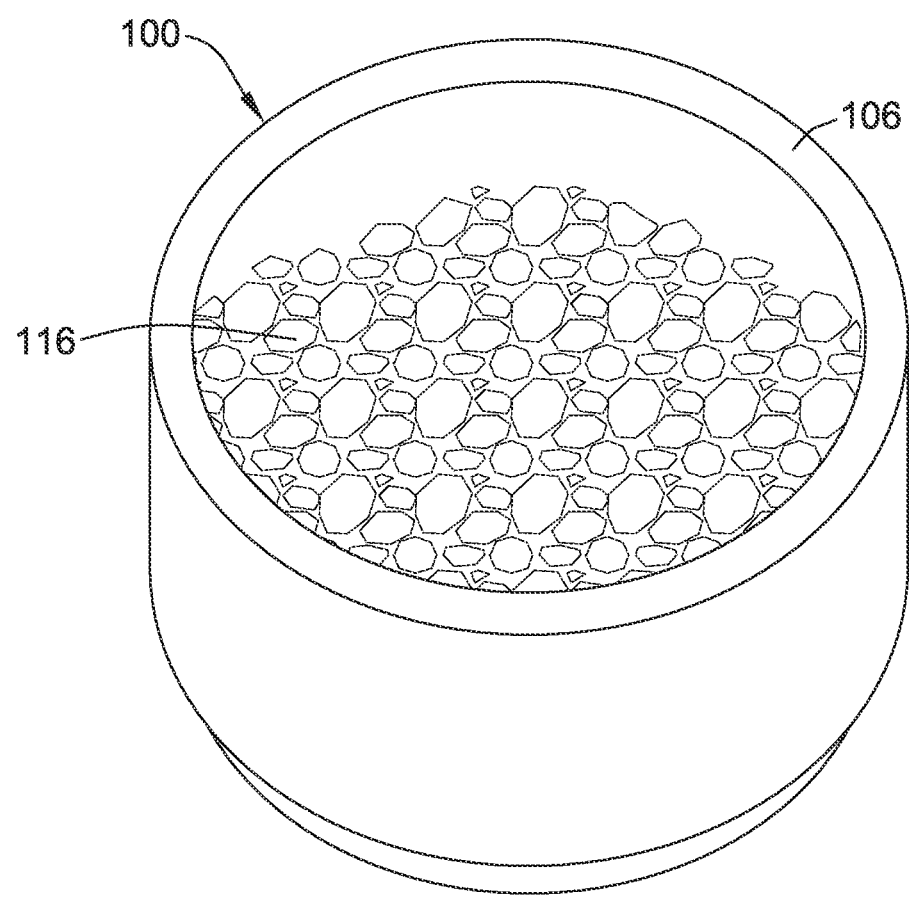
FIG. 2 shows the crucible of FIG. 1 loaded with a charge of polysilicon chunks.
Figure 3:
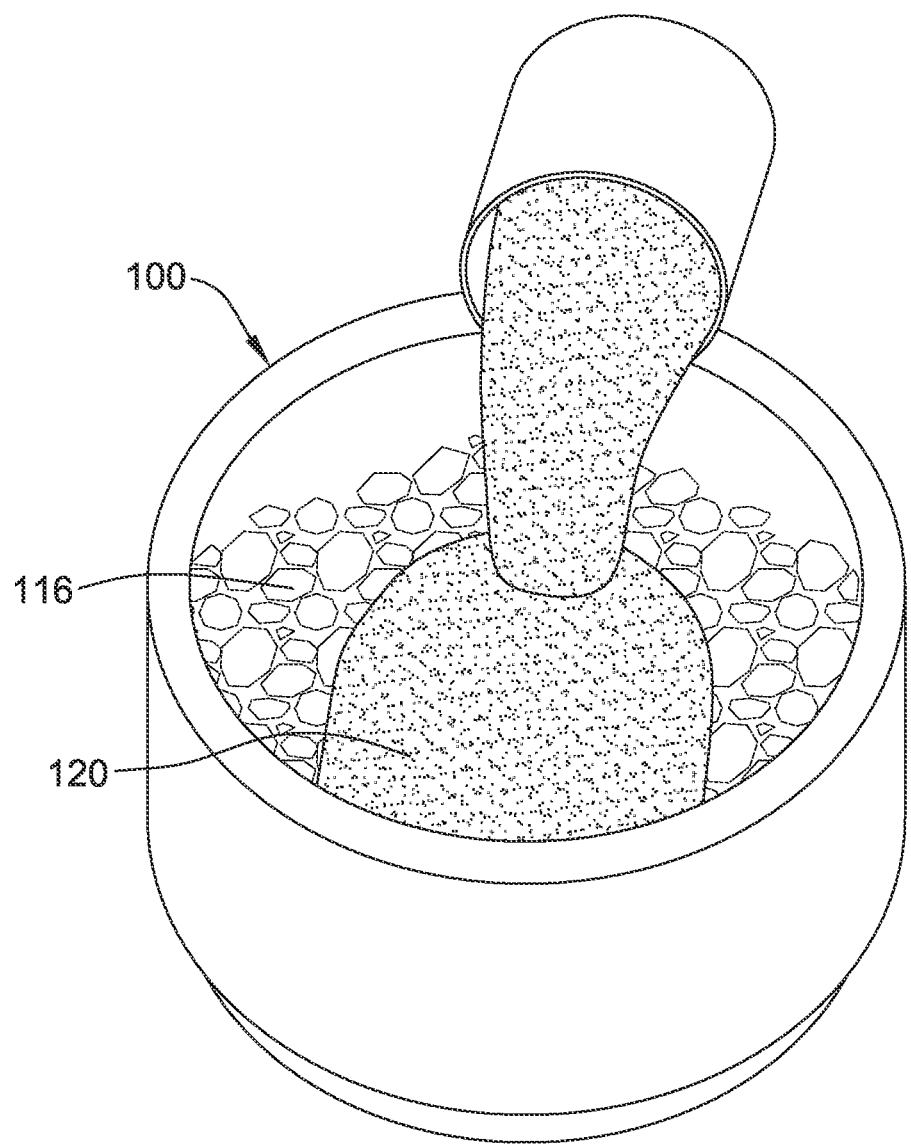
FIG. 3 shows the crucible of FIG. 2 with polysilicon granules being added.
Figure 4:
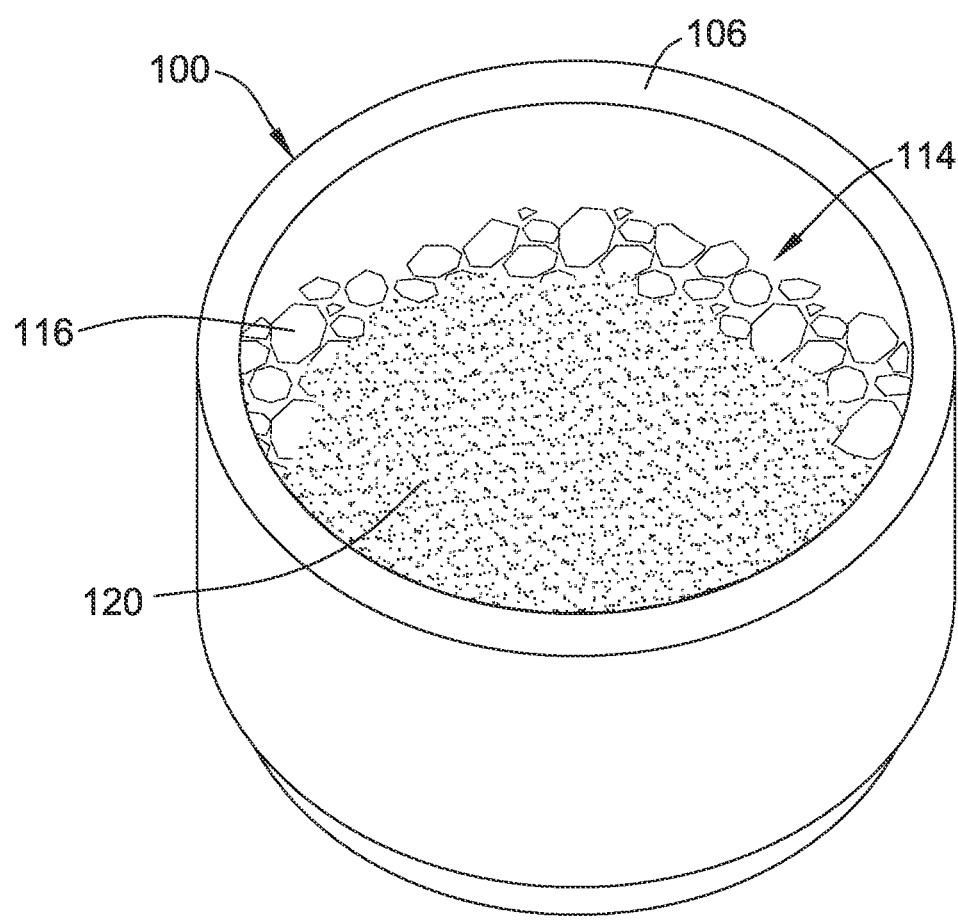
FIG. 4 shows the crucible of FIG. 3 after the polysilicon granules have been added.

In this embodiment, a plurality of layers of polysilicon chunks 116 and polysilicon granules 120 are alternately layered within the crucible 100. Referring to FIGS. 2-4, a sequence of adding layers of polysilicon chunks 116 and polysilicon granules 120 is shown. As shown in FIG. 2, an initial layer of polysilicon chunks 116 is placed within crucible 100 such that the crucible bottom 122 (FIG. 1) and crucible curvature region 124 are substantially covered. Subsequently, as shown in FIG. 3, a layer of polysilicon granules 120 are poured over the polysilicon chunks 116. The polysilicon granules substantially fill in voids within the layer of polysilicon chunks 116, thereby increasing the packing density. FIG. 4 shows an exemplary layer of polysilicon granules 120 over a layer of polysilicon chunks 116 within crucible 100. This sequence of adding a layer of polysilicon chunks 116 and polysilicon granules 120 may be repeated one or more times to form a plurality of layers of polysilicon chunks 116 and polysilicon granules 120, as shown in FIG. 1. In this embodiment, layers of polysilicon chunks 116 and polysilicon granules 120 are added until a total weight of the charge 114 is approximately 90 kg. One or more layers of polysilicon chunks 116 and one or more layers of polysilicon granules 120 each weigh approximately from about 10 kg to about 15 kg. In yet another embodiment, a final top layer of polysilicon chunks 116 are placed within the crucible 100. The top layer of polysilicon does not extend past rim 106 of crucible 100.

Polysilicon granules 120 may be poured into the crucible 100 using a bucket (not shown). A vacuum 126 (FIG. 1) may also be used to exhaust dust during the pouring step. One or more additional layers of polysilicon particles 118 may be added between polysilicon chunks 116 and polysilicon granules 120. In some embodiments, after the polysilicon charge 114 is loaded into the crucible 100, the crucible is heated, such as by energizing one or more of heaters 102 and 104 to melt the polysilicon charge 114 and out-gas the hydrogen from the polysilicon granules 120.

Figure 5:
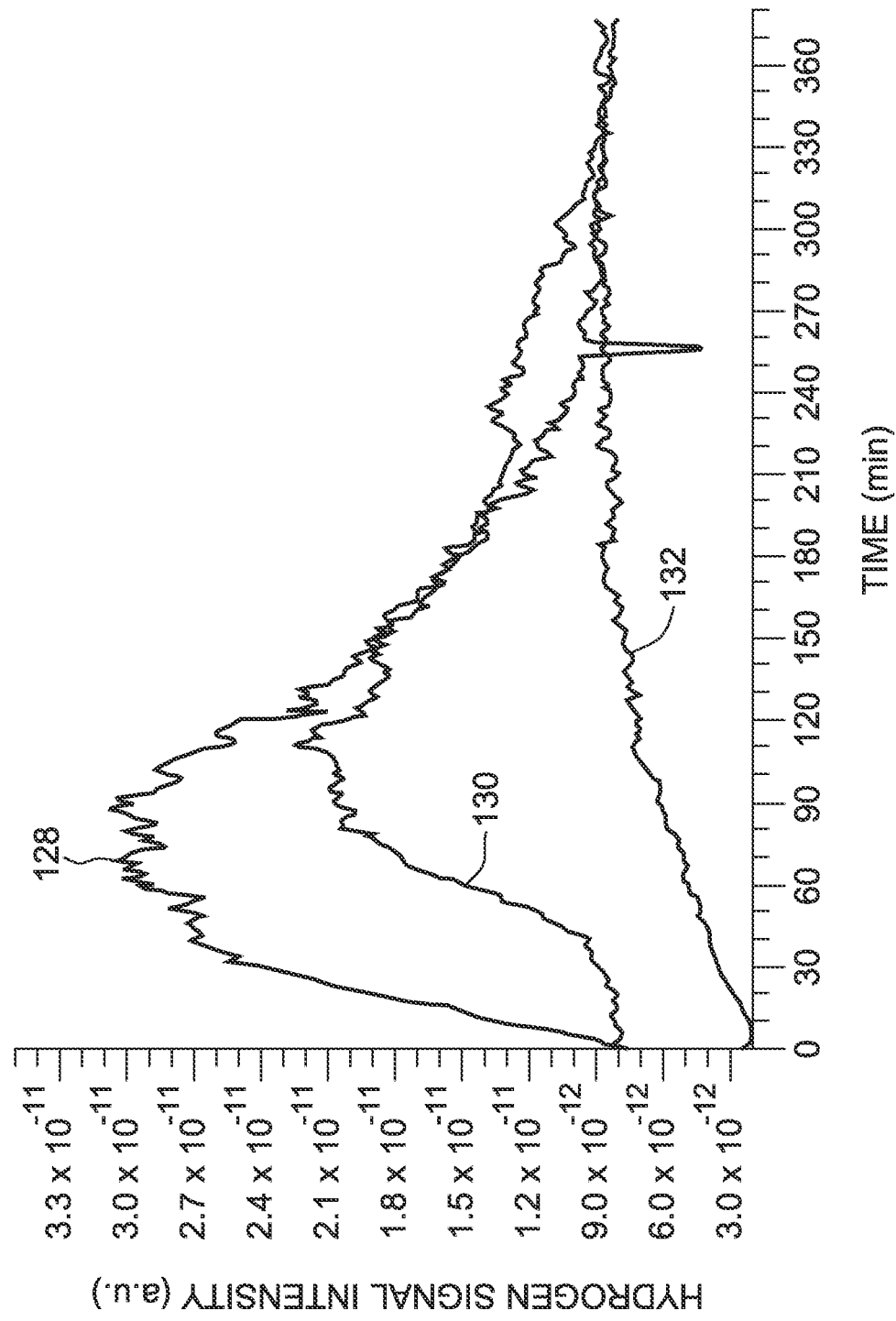
FIG. 5 shows a plot of a dehydrogenation rate of polysilicon granules.

FIG. 5 shows a plot of the emission rate of hydrogen gas from the polysilicon granules 120. The horizontal axis represents time in minutes, and the vertical axis is the hydrogen signal intensity measured by Residual Gas Analyzer in arbitrary units (a.u.). Line 128 represents the emission rate of hydrogen from polysilicon granules 120 formed by chemical vapor deposition (CVD) having a hydrogen content of approximately 22 parts per million weight (ppmw) heated using 90 kW applied to the heaters. Line 130 represents the emission rate of hydrogen from polysilicon granules 120 formed by CVD having a hydrogen content of approximately 22 ppmw heated using 70 kW applied to one of the heaters 102 and 104. Line 132 represents the emission rate of hydrogen from polysilicon granules 120 having hydrogen content of approximately 0.6 ppmw heated using 70 kW applied to one of the heaters 102 and 104.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of loading a crucible, comprising:
    loading a first layer of polysilicon chunks into the crucible;
    loading a second layer of granular polysilicon into the crucible; and
    loading a third layer of polysilicon particles into the crucible such that the following equation is satisfied:

$$PD_C=PD_L+(1-PD_L)PD_M+(1-PD_L)(1-PD_M)PD_S,$$

wherein:
    $PD_C$ is a packing density of a charge of polysilicon within the crucible;
    $PD_L$ is a packing density of the polysilicon chunks;
    $PD_M$ is a packing density of the polysilicon particles; and
    $PD_S$ is a packing density of the polysilicon granules, and wherein the packing density of polysilicon within the crucible is greater than about 0.70.

2. A method of loading a crucible according to claim 1, wherein the polysilicon particles are smaller than the polysilicon chunks and larger than the polysilicon granules.

3. A method of loading a crucible according to claim 1, wherein the crucible is loaded such that the packing density of polysilicon within the crucible is between about 0.70 and about 0.90.

4. A method of loading a crucible according to claim 1, further comprising classifying bulk polysilicon material into the polysilicon chunks having a large particle dimension and polysilicon granules having a small particle dimension, wherein a ratio of the large particle dimension to the small particle dimension is greater than about 7:1.

5. A method of loading a crucible according to claim 4, wherein the ratio of the large particle dimension to the small particle dimension is about 10:1.

6. A method of loading a crucible according to claim 4, wherein the ratio of the large particle dimension to the small particle dimension is about 100:1.

7. A method of loading a crucible according to claim 1, wherein loading a second layer of granular polysilicon into the crucible includes loading the second layer of granular polysilicon after adding the first quantity of polysilicon chunks.

8. A method of loading a crucible according to claim 1, further comprising alternately providing a plurality of layers of the polysilicon chunks and layers of the polysilicon granules.

9. A method of loading a crucible according to claim 8, further comprising providing the layers of the polysilicon chunks and the layers of the polysilicon granules until a total weight of the polysilicon chunks and polysilicon granules within the crucible is at least 90 kilograms.

10. A method of loading a crucible according to claim 8, wherein each layer of polysilicon chunks weighs about 10 kg to about 15 kg and each layer of granular polysilicon weighs about 10 kg to about 15 kg.

11. A method of loading a crucible according to claim 8, wherein providing the layers includes providing a top layer of polysilicon chunks.

12. A method of loading a crucible according to claim 1, wherein the crucible is loaded such that a height of the polysilicon charge does not extend past a rim of the crucible.

13. A method of loading a crucible according to claim 1, further comprising exhausting polysilicon dust using a vacuum.

14. A crucible comprising:
    a first layer of polysilicon chunks within the crucible;
    a second layer of granular polysilicon within the crucible;
    a third layer of polysilicon particles within the crucible;
    wherein the following equation is satisfied:

$$PD_C=PD_L+(1-PD_L)PD_M+(1-PD_L)(1-PD_M)PD_S,$$

wherein:
    $PD_C$ is the packing density of the charge of polysilicon within the crucible;
    $PD_L$ is a packing density of the polysilicon chunks;
    $PD_M$ is a packing density of the polysilicon particles; and
    $PD_S$ is a packing density of the polysilicon granules; and wherein the packing density of the combination of the first layer, the second layer, and the third layer of polysilicon within the crucible is greater than about 0.70.

15. A crucible according to claim 14, wherein the polysilicon particles are smaller than the polysilicon chunks and larger than the polysilicon granules.

16. A crucible according to claim 14, wherein the packing density of polysilicon within the crucible is between about 0.70 and about 0.90.

* * * * *